United States Patent
Yamada et al.

(10) Patent No.: US 6,632,532 B1
(45) Date of Patent: Oct. 14, 2003

(54) PARTICLE MATERIAL ANISOTROPIC CONDUCTIVE CONNECTION AND ANISOTROPIC CONDUCTIVE CONNECTION MATERIAL

(75) Inventors: Yukio Yamada, Kanuma (JP); Toshiyuki Matsumoto, Kanuma (JP)

(73) Assignee: Sony Chemicals Corp., Tokyo (JP)

( * ) Notice: Subject to any disclaimer, the term of this patent is extended or adjusted under 35 U.S.C. 154(b) by 0 days.

(21) Appl. No.: 09/693,892

(22) Filed: Oct. 23, 2000

(30) Foreign Application Priority Data

Nov. 5, 1999 (JP) ............ 11-315692
Jun. 14, 2000 (JP) ............ 2000-178408

(51) Int. Cl.⁷ .................. B32B 5/16
(52) U.S. Cl. .................. 428/403; 428/407
(58) Field of Search ............ 428/403, 407

(56) References Cited

U.S. PATENT DOCUMENTS

| | | | | |
|---|---|---|---|---|
| 4,425,017 A | * | 1/1984 | Chan ............ 339/96 |
| 4,575,432 A | * | 3/1986 | Lin et al. | |
| 4,742,110 A | * | 5/1988 | Sakashita et al. | |
| 5,334,330 A | * | 8/1994 | Rowlette ............ 252/512 |
| 5,672,297 A | * | 9/1997 | Soane ............ 252/511 |
| 5,840,215 A | * | 11/1998 | Iyer et al. ............ 252/500 |
| 6,039,896 A | * | 3/2000 | Miyamoto et al. ............ 252/511 |
| 6,149,857 A | * | 11/2000 | McArdle et al. ............ 264/429 |
| 6,399,675 B1 | * | 6/2002 | Kim et al. | |

FOREIGN PATENT DOCUMENTS

| | | |
|---|---|---|
| JP | 7-197001 | 8/1995 |
| JP | 11-241054 | 9/1999 |

OTHER PUBLICATIONS

T. Kondo and M. Koishi, "Microcapsules, Revised Third Edition", pp. 64–75, published Jan. 20, 1995 by Sankyo Publishing.

* cited by examiner

Primary Examiner—H. Thi Le
(74) Attorney, Agent, or Firm—Oliff & Berridge, PLC

(57) ABSTRACT

A particle material for anisotropic conductive connection, is comprised of a conductive particle and an insulating resin layer covering the surface thereof, wherein the insulating resin layer includes an insulating gelled resin with a gel proportion of at least 90%. The particle material can be manufactured by fixing an insulating gelled resin powder with a gel proportion of at least 90% to the surface of the conductive particle by a physical/mechanical method to form the insulating resin layer.

9 Claims, 1 Drawing Sheet

PARTICLE MATERIAL ANISOTROPIC CONDUCTIVE CONNECTION AND ANISOTROPIC CONDUCTIVE CONNECTION MATERIAL

BACKGROUND OF THE INVENTION

1. Field of the Invention

The present invention relates to a particle material for anisotropic conductive connection, and to a method for manufacturing the same.

2. Description of the Related Art

The connection terminals of semiconductors are routinely connected to the connection terminals of the mounting substrates thereof by anisotropic conductive connection. In this anisotropic conductive connection, an anisotropic conductive connection material in the form of a film or paste, comprising fine conductive particles dispersed in an insulating adhesive agent, is sandwiched between materials to be connected, and this assembly is heated and pressed to bond and electrically connect the two materials.

Recently we have seen the patterns of the connection terminals subjected to anisotropic conductive connection become finer and finer, which raises the concern that shorts might occur during anisotropic conductive connection. Consequently, conductive particles covered with a thin thermoplastic resin layer or thermosetting resin layer have come to be used as the conductive particles for anisotropic conductive connection.

Unfortunately, when conductive particles are covered with a thermoplastic resin, the thermoplastic resin film sometimes comes off depending on the solvent used in the manufacture of the anisotropic conductive connection material, and this limits which solvents and which compositional blends can be used. Furthermore, shorting between adjacent patterns caused by the heating and pressing involved in anisotropic conductive connection can no longer be ignored. Also, since the proportion of thermoplastic resin increases when the amount of conductive particles contained in the anisotropic conductive connection material is increased, another problem is lower heat resistance of the anisotropic conductive connection material. Finally, as the spacing narrows between bumps to be connected, the conductive particles tend to aggolomerate due to the softening of the thermoplastic resin on the surface of the conductive particles, resulting in inferior insulation characteristics (that is, how well insulation is maintained between patterns to be insulated).

Meanwhile, the problems encountered in the use of conductive particles covered with a thermoplastic resin do not occur in the case of conductive particles covered with a thermosetting resin, but another problem occurs such that high pressing force is required to break up the insulating cover film of the conductive particles during anisotropic conductive connection, which damages the materials being connected.

SUMMARY OF THE INVENTION

The present invention was conceived in an effort to solve the above problems encountered with prior art, and it is an object thereof to provide a particle material in which the drawbacks to conventional conductive particles for anisotropic conductive connection that are covered with a thermoplastic resin or thermosetting resin are improved, as well as a method for manufacturing these conductive particles.

The inventors perfected the present invention upon discovering that the stated object could be achieved by using an insulating gelled resin with a gel proportion of at least 90% as the insulating resin that covers the conductive particles.

Specifically, the present invention provides a particle material for anisotropic conductive connection, comprising a conductive particle and an insulating resin layer covering the surface thereof, wherein the insulating resin layer is composed of an insulating gelled resin with a gel proportion of at least 90%.

The present invention also provides a method for manufacturing a particle material for anisotropic conductive connection, the particle material comprising a conductive particle and an insulating resin layer covering the surface thereof, wherein the method comprises fixing an insulating gelled resin powder with a gel proportion of at least 90% to the surface of a conductive particle by a physical/mechanical method to form the insulating resin layer.

DETAILED DESCRIPTION OF THE INVENTION

Figure 1:
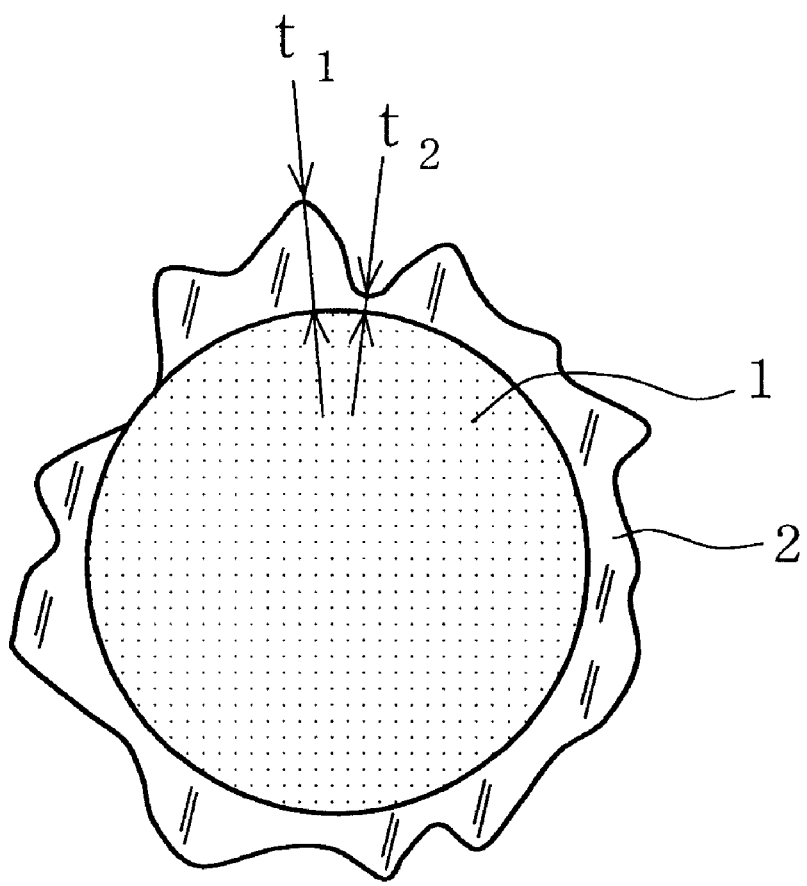
FIG. 1 is a cross section of a conductive particle for anisotropic conductive connection.

The present invention will now be described in detail.

As shown in FIG.1, the particle material fro anisotropic conductive connection of the present invention is composed of a conductive particle and an insulating resin layer 2 that covers the surface thereof.

In the present invention, the insulating resin layer 2 is made up of an insulating gelled resin whose gel proportion is at least 90%, and preferably at least 95%. It is undesirable for the gel proportion to be less than 90% because the insulation characteristics of the anisotropic conductive connection material will deteriorate.

The term gel proportion as used here is the gel proportion with respect to the solvent used in the preparation of the anisotropic conductive connection material (at least ethyl acetate, butyl acetate, toluene, n-butanol, methyl isobutyl ketone, xylene, tetrahydrofuran, or methyl ethyl ketone).

The gel proportion is calculated as follows. 1 g of insulating resin powder is washed centrifugally (50 rpm) for 1 hour in 10 mL of solvent, then centrifugal washing is performed two more times using different solvents, and the weight percentage of the insulating resin after washing with respect to the insulating resin before washing is termed the gel proportion.

The gel proportion can be adjusted by varying the amount of polyfunctional monomer used in the manufacture of the insulating gelled resin.

An insulating gelled resin with a gel proportion of at least 90% is used in the present invention, but of these, the use of one whose softening point is higher than the heating temperature during anisotropic conductive connection is preferred. The insulation characteristics will tend to deteriorate if an insulating gelled resin having a softening point lower than the heating temperature during anisotropic conductive connection is used.

The heating temperature during anisotropic conductive connection will vary with the type of adhesive agent being used and other factors, but is generally between 130 and 200° C.

Also, conduction characteristics will deteriorate if the proportion of the thickness (average thickness) of the insulating resin layer 2 to the diameter of the conductive particles 1 is too large in the conductive particles for anisotropic conductive connection of the present invention, but insulation characteristics will deteriorate if this layer is too thin, so the thickness is preferably at least 10 nm but no more than ⅕ the diameter of the conductive particles 1.

In regard to the thickness of the insulating resin layer 2, the following formula (1) is preferably satisfied in order to easily ensure conduction by breaking the insulating layer, if we let $t_1$ be the maximum thickness of the insulating resin layer and $t_2$ be the minimum thickness (see FIG. 1).

$$2 \leq t_1/t_2 \leq 10 \tag{1}$$

Here, data for the maximum thickness $t_1$ and minimum thickness $t_2$ is preferably obtained by measuring the cross section of the conductive particles for anisotropic conductive connection of the present invention by electron microscopy.

With the particle material for anisotropic conductive connection of the present invention, the coverage of the insulating resin layer 2 on the conductive particle 1 is preferably at least 50%, and even more preferably 60 to 99%, because insulation characteristics will deteriorate if the coverage is too low, but complete coverage will cause distortion to occur due to the difference in the linear coefficients of expansion between the conductive particle 1 and the insulating resin layer 2, and this distortion will produce cracks in the insulating resin layer 2, making it difficult to eliminate the insulating resin layer 2 from the press-bonding surface during press-bonding, increasing the connection resistance, and causing other such problems.

Examples of insulating gelled resins that exhibit the above properties include styrene-divinylbenzene resins and acrylic-styrene resins, but an acrylic-styrene resin is preferable in terms of solvent resistance and heat resistance.

In the present invention, the same conductive particles for anisotropic conductive connection as those used in the past can be used as the conductive particle 1 covered with the insulating gelled resin. For instance, solder particles, nickel particles, or other metal particles, composite conductive particles produced by metal-plating the surface of resin particles, or the like can be used.

The particle material for anisotropic conductive connection of the present invention can be manufactured by fixing the above-mentioned insulating gelled resin powder with a gel proportion of at least 90% to the surface of the conductive particle 1 by a physical/mechanical method to cover the conductive particle 1 with the insulating resin layer 2. The term physical/mechanical method as used here refers to a dry method of joining fine powders together. More specifically, while a powder produced by covering a core particle with fine particles which are smaller than the core particle is dispersed in the vapor phase, thermomechanical energy whose main component is impact force is imparted to this powder, and fixing is conducted for a short time (1 to 5 minutes) (T. Kondo and M. Koishi, "Microcapsules, Revised Third Edition," pp. 64–75, published Jan. 20, 1995 by Sankyo Publishing). Specifically, the particle material can be manufactured by using a hybridization system made by Nara Kikai Seisakusho (Hybridizer Model 0). The specific operating conditions can be suitably determined as dictated by the raw materials and apparatus being used.

When the particle material for anisotropic conductive connection is manufactured by the above physical/mechanical method, it is preferable if the specific surface area $S_1$ of the conductive particle and the specific surface area $S_2$ of the insulating gelled resin powder satisfy the following formula (2):

$$S_2 > 10 \times S_1 \tag{2},$$

and the primary particle diameter $R_1$ of the conductive particle and the primary particle diameter $R_2$ of the insulating gelled resin powder satisfy the following formula (3):

$$R_1 > 3 \times R_2 \tag{3}.$$

This is because the surface will tend not to be sufficiently covered with the insulating resin if $S_2$ is not more than $(10 \times S_1)$, and the surface will tend to be uneven if $R_1$ is not more than $(3 \times R_2)$.

As to the insulating gelled resin used in the manufacture of the particle material for anisotropic conductive connection, the softening point thereof, the relation between the layer thickness thereof and the diameter of the conductive particle, the relation between the maximum thickness and the minimum thickness, and the coverage are as described for the particle material for anisotropic conductive connection of the present invention.

The particle material for anisotropic conductive connection of the present invention as described above can be dispersed in an insulating adhesive agent to manufacture an anisotropic conductive connection material in the form of a paste or film. The same adhesive agents as those used in known anisotropic conductive connection materials can be used as this insulating adhesive agent.

A connection structure that exhibits good connection strength, insulation characteristics, and conduction characteristics can be obtained by sandwiching an anisotropic conductive connection material in which the particle material for anisotropic conductive connection of the present invention is used between two opposing connection materials such as a semiconductor device and its mounting substrate, or a flexible printed substrate and a liquid crystal display), and hot pressing this assembly.

EXAMPLES

The present invention will now be described in specific terms through experimental examples.

Experimental Examples A1 to A9

Conductive particles (specific surface area=1.3 m²/g) produced by plating the surface of benzoguanamine particles (5 μm diameter) with nickel and gold were covered with an insulating gelled resin powder (an acrylic-styrene resin; specific surface area=26.5 m²/g, gel proportion=98% or higher) by physical/mechanical method (Hybridizer Model 0 hybridization system made by Nara Kikai Seisakusho), which yielded particle materials for anisotropic conductive connection, in which a conductive particle is covered with an insulating resin layer composed of an insulating gelled resin. Table 1 shows the coverage (%) of the insulating resin layer of the obtained conductive particles, the average thickness (μm) of the insulating resin layer, and the ratio $(t_1/t_2)$ between the maximum thickness $t_1$ and the minimum thickness $t_2$ of the insulating resin layer.

TABLE 1

| Experimental Example | Coverage (%) | Average film thickness (μm) | Ratio ($t_1/t_2$) |
|---|---|---|---|
| A1 | 100 | 0.5 | 1.5 |
| A2 | 50 | 0.5 | 1.5 |
| A3 | 40 | 0.5 | 1.5 |
| A4 | 98 | 0.5 | 1.5 |

TABLE 1-continued

| Experimental Example | Coverage (%) | Average film thickness ($\mu$m) | Ratio ($t_1/t_2$) |
|---|---|---|---|
| A5 | 80 | 0.5 | 1.5 |
| A6 | 100 | 0.5 | 4.5 |
| A7 | 100 | 0.5 | 7.0 |
| A8 | 100 | 0.5 | 11.0 |
| A9 | 80 | 1.5 | 4.5 |

Experimental Examples B1 to B4

Conductive particles (specific surface area=1.3 m$^2$/g) produced by plating the surface of benzoguanamine particles (5 $\mu$m diameter) with nickel and gold were covered with a styrene-divinylbenzene resin powder having the gel proportion (to toluene), degree of crosslinking, and specific surface area shown in Table 2 as the insulating gelled resin by physical/mechanical method (Hybridizer Model 0 hybridization system made by Nara Kikai Seisakusho), which yielded particle materials for anisotropic conductive connection, in which a conductive particle is covered with an insulating resin layer composed of an insulating gelled resin. Table 2 shows the coverage (%) of the insulating resin layer of the obtained conductive particles, the average thickness ($\mu$m) of the insulating resin layer, the ratio ($t_1/t_2$) between the maximum thickness $t_1$ and the minimum thickness $t_2$ of the insulating resin layer, and the softening point (° C.).

TABLE 2

| Experimental example | B1 | B2 | B3 | B4 |
|---|---|---|---|---|
| Degree of crosslinking (%) | 1 | 3 | 5 | 10 |
| Gel proportion (%) | 20 | 70 | 90 | 98 |
| Specific surface area (m$^2$/g) | 21.3 | 20.6 | 23.2 | 22.1 |
| Coverage (%) | 95 | 95 | 95 | 95 |
| Average film thickness ($\mu$m) | 0.5 | 0.5 | 0.5 | 0.5 |
| Ratio ($t_1/t_2$) | 4.5 | 4.2 | 4.9 | 4.1 |
| Softening point (° C.) | 40 | 80 | 100 | 200 |

Evaluation

The particle material for anisotropic conductive connection obtained in the above experimental examples was added and uniformly mixed in an amount of 10 vol % to a mixture composed of 60 weight parts bis A-type solid epoxy resin (Ep 1009, made by Shell Petrochemical), 40 weight parts latent curing agent (H×394HP, made by Asahi Chemical), and 70 weight parts toluene. This mixture was coated in a dry thickness of 25 $\mu$m with a silicone-treated polyethylene terephthalate film, and this coating was dried to produce an anisotropic conductive connection film.

The anisotropic conductive connection film thus produced was sandwiched between glass substrates equipped with semiconductor devices at a pitch of 50 $\mu$m (bump size: 35×80 $\mu$m, bump spacing: 15 $\mu$m, bump height: 20 $\mu$m) and ITO at a pitch of 50 $\mu$m (metallization width: 35 $\mu$m, metallization spacing: 15 $\mu$m), and a connection structure was obtained by press bonding for 10 seconds at a temperature of 200° C. and a pressure of 3.92×10$^7$ Pa. The connection structure thus obtained was evaluated for conduction characteristics and insulation characteristics as described below. The obtained results are given in Table 3.

Conduction Characteristics

Symbol Evaluation Criteria

A: when the initial resistance of all 100 connected pins is 5 Ω or less

B: when the greatest initial resistance among the 100 connected pins is over 5 Ω but less than 10 Ω

C: when the greatest initial resistance among the 100 connected pins is over 10 Ω

Insulation Characteristics

Symbol Evaluation Criteria

A: when the resistance of 100 disconnected pins is at least 10$^8$ Ω

B: when the least resistance of 100 disconnected pins is at least 10$^6$ Ω

C: when the least resistance of 100 disconnected pins is less than 10$^6$ Ω

TABLE 3

| Experimental example | Conduction characteristics | Insulation characteristics |
|---|---|---|
| A1 | B | A |
| A2 | A | A |
| A3 | A | B |
| A4 | A | A |
| A5 | A | A |
| A6 | A | A |
| A7 | A | A |
| A8 | A | A |
| A9 | B | A |
| B1 | A | B |
| B2 | A | B |
| B3 | A | B |
| B4 | A | A |

It can be seen from the results in Tables 1 to 3 and from the results of Experimental Examples B1, B2, and B4 that conductive particles covered with an insulating gelled resin whose gel proportion is at least 90% have superior conduction characteristics and insulation characteristics. It can be seen from Experimental Example B3 that the insulation characteristics tend to be inferior when the softening point of the insulating gelled resin is lower than the heating temperature during anisotropic conductive connection.

It can also be seen from Experimental Examples A2 and A3 that the preferred coverage by the insulating gelled resin is at least 50%.

Furthermore, it can be seen from the results of Experimental Example A9 that the conduction characteristics are inferior if the thickness of the insulating gelled resin layer is substantially the same as the diameter of the conductive particles.

The conductive particles for anisotropic conductive connection of the present invention, despite being covered on their surface with an insulating resin, exhibit excellent conduction characteristics and insulation characteristics, and therefore represent an improvement in terms of drawbacks over conventional conductive particles for anisotropic conductive connection covered with a thermoplastic resin or a thermosetting resin.

The disclosures of the specifications, claims and drawings of Japanese Patent Applications No. 11-315692 and 2000-178408 filed on Nov. 5, 1999 and Jun. 14, 2000, respectively, are hereby incorporated by reference.

What is claimed is:

1. A particle material for anisotropic conductive connection, comprising a conductive particle and an insulating resin layer covering the surface thereof, wherein the insulating resin layer comprises an insulating gelled resin with a gel proportion of at least 90%, wherein the conductive particle is not completely covered by the insulating resin layer, and wherein the insulating gelled resin has a softening point higher than the heating temperature during anisotropic conductive connection.

2. The particle material for anisotropic conductive connection as defined in claim 1, wherein the thickness of the insulating resin layer is at least 10 μm but no more than ⅕ the diameter of the conductive particles.

3. The particle material for anisotropic conductive connection as defined in claim 1, wherein the following formula (1) is satisfied if $t_1$ is the maximum thickness of the insulating resin layer and $t_2$ is the minimum thickness.

$$2 \leq t_1/t_2 \leq 10 \tag{1}$$

4. The particle material for anisotropic conductive connection as defined in claim 1, wherein the coverage of the insulating resin layer is at least 50%.

5. The particle material for anisotropic conductive connection as defined in claim 1, wherein the insulating gelled resin is an acrylic-styrene resin.

6. An anisotropic conductive connection material in which the particle materials for anisotropic conductive connection defined in claim 1 are dispersed in an insulating adhesive agent.

7. A connection structure obtained by connecting two opposing materials to be connected by use of the anisotropic conductive connection material defined in claim 6.

8. A method for manufacturing a particle material for anisotropic conductive connection, the particle material comprising a conductive particle and an insulating resin layer having a softening point higher than the heating temperature during anisotropic conductive connection covering the surface thereof, wherein the method comprises fixing an insulating gelled resin powder with a gel proportion of at least 90% to the surface of a conductive particle by a physical/mechanical method to form the insulating resin layer.

9. The manufacturing method as defined in claim 8, wherein the specific surface area $S_1$ of the conductive particles and the specific surface area $S_2$ of the insulating gelled resin powder satisfy the following formula (2):

$$S_2 > 10 \times S_1 \tag{2},$$

and the primary particle diameter $R_1$ of the conductive particles and the primary particle diameter $R_2$ of the insulating gelled resin powder satisfy the following formula (3):

$$R_1 > 3 \times R_2 \tag{3}.$$

* * * * *